United States Patent
Ning et al.

(10) Patent No.: US 11,627,024 B2
(45) Date of Patent: Apr. 11, 2023

(54) WIDEBAND VECTOR MODULATOR PHASE SHIFTER

(71) Applicant: Mixcomm, Inc., Chatham, NJ (US)

(72) Inventors: Kang Ning, Lawrence, NJ (US); Harish Krishnaswamy, New York, NY (US); Arun Natarajan, Corvallis, OR (US)

(73) Assignee: Mixcomm, Inc., Chatham, NJ (US)

( * ) Notice: Subject to any disclaimer, the term of this patent is extended or adjusted under 35 U.S.C. 154(b) by 0 days.

(21) Appl. No.: 17/510,306

(22) Filed: Oct. 25, 2021

(65) Prior Publication Data

US 2022/0131726 A1    Apr. 28, 2022

Related U.S. Application Data

(60) Provisional application No. 63/106,174, filed on Oct. 27, 2020.

(51) Int. Cl.
*H03K 5/13* (2014.01)
*H04L 27/20* (2006.01)
*H03K 5/01* (2006.01)

(52) U.S. Cl.
CPC ............. *H04L 27/20* (2013.01); *H03K 5/01* (2013.01)

(58) Field of Classification Search
CPC .................................. H04L 27/20; H03K 5/01
USPC ........................................................ 327/254
See application file for complete search history.

(56) References Cited

U.S. PATENT DOCUMENTS

| | | | | |
|---|---|---|---|---|
| 4,520,476 A | * | 5/1985 | Searl | H04B 1/56 370/278 |
| 4,581,595 A | * | 4/1986 | Silagi | H03H 7/20 333/156 |
| 4,737,739 A | * | 4/1988 | Rosier | H03H 11/245 333/81 R |
| 5,019,793 A | * | 5/1991 | McNab | H01P 5/04 333/156 |
| 5,355,103 A | * | 10/1994 | Kozak | H03H 7/20 333/81 R |
| 5,742,201 A | * | 4/1998 | Eisenberg | H03G 1/0064 330/136 |
| 6,016,304 A | * | 1/2000 | Kyle | H03C 5/00 370/207 |
| 6,853,691 B1 | * | 2/2005 | Kim | H04L 27/362 375/353 |

(Continued)

OTHER PUBLICATIONS

M. Muraguchi, T. Yukitake and Y. Naito, "Optimum Design of 3-Db Branch-Line Couplers Using Microstrip Lines," in IEEE Transactions on Microwave Theory and Techniques, vol. 31, No. 8, pp. 674-678, Aug. 1983, doi: 10.1109/TMTT.1983.1131568.

(Continued)

*Primary Examiner* — Ryan Jager
(74) *Attorney, Agent, or Firm* — Straub & Straub; Michael P. Straub; Stephen T. Straub

(57) ABSTRACT

Methods and apparatus for implementing passive wideband phase shifters are described. The phase shifters exhibit good linearity over a wide range of frequencies. Furthermore at least some features are directed to allowing the phase shifters to be implemented in some embodiments in a relatively compact manner making such embodiments well suited for supporting arrays and/or other implementations where a large number of phase shifters are to be implemented in a relatively small chip area.

12 Claims, 10 Drawing Sheets

(56) References Cited

U.S. PATENT DOCUMENTS

| | | | | |
|---|---|---|---|---|
| 7,469,017 | B2* | 12/2008 | Granstrom | H04B 1/0483 |
| | | | | 370/320 |
| 8,203,394 | B2* | 6/2012 | Kim | H04B 7/10 |
| | | | | 455/110 |
| 11,349,503 | B2* | 5/2022 | Mohammadi | H03F 3/19 |
| 2005/0281350 | A1* | 12/2005 | Chae | H04B 7/068 |
| | | | | 375/267 |
| 2005/0281351 | A1* | 12/2005 | Jeong | H04L 1/0618 |
| | | | | 375/267 |
| 2009/0086713 | A1 | 4/2009 | Luo | |
| 2010/0231452 | A1 | 9/2010 | Babakhani et al. | |
| 2014/0099893 | A1* | 4/2014 | Kheirkhahi | H04B 1/525 |
| | | | | 455/41.2 |
| 2018/0316093 | A1* | 11/2018 | Sharvit | H03H 11/20 |
| 2019/0068240 | A1 | 2/2019 | Michaels | |
| 2019/0157771 | A1* | 5/2019 | Li | H01Q 21/065 |
| 2020/0145160 | A1 | 5/2020 | Jiang et al. | |
| 2020/0274564 | A1 | 8/2020 | Abhishek et al. | |
| 2020/0350679 | A1* | 11/2020 | Yu | H01P 1/18 |
| 2021/0005946 | A1* | 1/2021 | Roch | H04B 7/0617 |
| 2022/0131726 | A1* | 4/2022 | Ning | H04L 27/20 |

OTHER PUBLICATIONS

Y. Hou, L. Li, R. Qian and X. Sun, "An Efficient Technique for Designing High-Performance Millimeter-Wave Vector Modulators With Low Temperature Drift," in IEEE Transactions on Microwave Theory and Techniques, vol. 56, No. 12, pp. 3100-3107, Dec. 2008, doi: 10.1109/TMTT.2008.2006808.

R. Darraji, F. M. Ghannouchi and O. Hammi, "A Dual-Input Digitally Driven Doherty Amplifier Architecture for Performance Enhancement of Doherty Transmitters," in IEEE Transactions on Microwave Theory and Techniques, vol. 59, No. 5, pp. 1284-1293, May 2011, doi: 10.1109/TMTT.2011.2106137.

D. Pepe and D. Zito, "Two mm-Wave Vector Modulator Active Phase Shifters With Novel IQ Generator in 28 nm FDSOI CMOS," in IEEE Journal of Solid-State Circuits, vol. 52, No. 2, pp. 344-356, Feb. 2017, doi: 10.1109/JSSC.2016.2605659.

V. Vorapipat, C. S. Levy and P. M. Asbeck, "Voltage Mode Doherty Power Amplifier," in IEEE Journal of Solid-State Circuits, vol. 52, No. 5, pp. 1295-1304, May 2017, doi: 10.1109/JSSC.2017.2647954.

R. Garg and A. S. Natarajan, "A 28-GHz Low-Power Phased-Array Receiver Front-End With 360° RTPS Phase Shift Range," in IEEE Transactions on Microwave Theory and Techniques, vol. 65, No. 11, pp. 4703-4714, Nov. 2017, doi: 10.1109/TMTT.2017.2707414.

N. Rostomyan, J. A. Jayamon and P. M. Asbeck, "15 GHz Doherty Power Amplifier With RF Predistortion Linearizer in CMOS SOI," in IEEE Transactions on Microwave Theory and Techniques, vol. 66, No. 3, pp. 1339-1348, Mar. 2018, doi: 10.1109/TMTT.2017.2772785.

P. Gu, D. Zhao and X. You, "A DC-50 GHz CMOS Switched-Type Attenuator With Capacitive Compensation Technique," in IEEE Transactions on Circuits and Systems I: Regular Papers, vol. 67, No. 10, pp. 3389-3399, Oct. 2020, doi: 10.1109/TCSI.2020.2999094.

Pozar, D. M., Microwave Engineering, 4th Edition, Hoboken, NJ: J. Wiley, ISBN-10: 0470631554, cover page, p. 332 and pp. 359-362, copyright 2012.

International Search Report and Written Opinion of the International Searching Authority from PCT/US2021/056603, dated Jan. 28, 2022 pp. 1-7.

* cited by examiner

| ATTENUATION | CONTROL LINE SETTINGS | | | | |
|---|---|---|---|---|---|
| | $AC_{V0.5dB}$ | $AC_{V2dB}$ | $AC_{V8dB}$ | $AC_{V4dB}$ | $AC_{V1dB}$ |
| 0 dB | 1 | 1 | 1 | 1 | 1 |
| 0.5 dB | 0 | 1 | 1 | 1 | 1 |
| 1.0 dB | 1 | 1 | 1 | 1 | 0 |
| 1.5 dB | 0 | 1 | 1 | 1 | 0 |
| 2.0 dB | 1 | 0 | 1 | 1 | 1 |
| 2.5 dB | 0 | 0 | 1 | 1 | 1 |
| 3.0 dB | 1 | 0 | 1 | 1 | 0 |
| 3.5 dB | 0 | 0 | 1 | 1 | 0 |
| 4.0 dB | 1 | 1 | 1 | 0 | 1 |
| 4.5 dB | 0 | 1 | 1 | 0 | 1 |
| 5.0 dB | 1 | 1 | 1 | 0 | 0 |
| 5.5 dB | 0 | 1 | 1 | 0 | 0 |
| 6.0 dB | 1 | 0 | 1 | 0 | 1 |
| 6.5 dB | 0 | 0 | 1 | 0 | 1 |
| 7.0 dB | 1 | 0 | 1 | 0 | 0 |
| 7.5 dB | 0 | 0 | 1 | 0 | 0 |
| 8.0 dB | 1 | 1 | 0 | 1 | 1 |
| 8.5 dB | 0 | 1 | 0 | 1 | 1 |
| 9.0 dB | 1 | 1 | 0 | 1 | 0 |
| 9.5 dB | 0 | 1 | 0 | 1 | 0 |
| 10.0 dB | 1 | 0 | 0 | 1 | 1 |
| 10.5 dB | 0 | 0 | 0 | 1 | 1 |
| 11.0 dB | 1 | 0 | 0 | 1 | 0 |
| 11.5 dB | 0 | 0 | 0 | 1 | 0 |
| 12.0 dB | 1 | 1 | 0 | 0 | 1 |
| 12.5 dB | 0 | 1 | 0 | 0 | 1 |
| 13.0 dB | 1 | 1 | 0 | 0 | 0 |
| 13.5 dB | 0 | 1 | 0 | 0 | 0 |
| 14.0 dB | 1 | 0 | 0 | 0 | 1 |
| 14.5 dB | 0 | 0 | 0 | 0 | 1 |
| 15.0 dB | 1 | 0 | 0 | 0 | 0 |
| 15.5 dB | 0 | 0 | 0 | 0 | 0 |

FIGURE 8

WIDEBAND VECTOR MODULATOR PHASE SHIFTER

RELATED APPLICATIONS

The present application claims the benefit of U.S. Provisional Application Ser. No. 63/106,174, filed Oct. 27, 2020, which is hereby expressly incorporated by reference in its entirety.

FIELD

The present application relates to methods and apparatus for implementing and using wideband vector modulator phase shifters and more particularly passive wideband vector modulator phase shifters which are well suited for use in wireless communications devices.

BACKGROUND

Phased array systems require a variable gain amplifier (VGA) and a phase shifter in each channel for beamforming. There are two kinds of phase shifters: active and passive. Active phase shifters could be wideband, but they have drawbacks of having higher power consumption, low linearity and high noise. Prior art passive phase shifters have advantages of high linearity, low noise and zero power consumption, but they exhibit narrow bandwidth and high insertion loss. Another drawback of some prior art passive phase shifters is that a large chip area is required.

FIG. 1 includes a drawing 100 illustrating a typical prior art passive phase shifter topology, namely the reflective-type phase shifter (RTPS) 102, a corresponding phase vs frequency plot 104 and a corresponding magnitude vs frequency plot 106. The phase has ripples across the frequency, as shown in plot 104; and the magnitude response is rather narrowband, as shown in plot 106. These effects occur because the RTPS uses a resonant CLC load, where the resonance frequency is changed through varactors.

Passive devices avoid the need for amplifiers or other powered devices that introduce positive gain that may distort the signal passing through the device and have the further advantage of being able to pass signals in both directions allowing the phase shifter to operate both with received and transmitted signals. In view of the above, it should be appreciated that there is a need for new and/or improved phase shifters and more particularly, a need for passive wideband phase shifters.

SUMMARY

Methods and apparatus for implementing passive wideband phase shifters are described. The phase shifters exhibit good linearity over a wide range of frequencies. Furthermore at least some features are directed to allowing the phase shifters to be implemented in some embodiments in a relatively compact manner making such embodiments well suited for supporting arrays and/or other implementations where a large number of phase shifters are to be implemented in a relatively small chip area.

An exemplary vector modulator based phase shifter, in accordance with some embodiments, comprises: an In-phase and Quadrature phase (IQ) signal generator including a radio frequency (RF) signal input, an in-phase (I) signal output and a quadrature (Q) signal output; a combined signal attenuator and sign flip module having an in-phase (I) signal input coupled to the I signal output of the IQ signal generator and having a quadrature (Q) signal input coupled to a quadrature (Q) signal output of the IQ signal generator, said combined signal attenuator and sign flip module including a first output coupled to said I signal input of the combined signal attenuator and sign flip module by a first attenuator and a first sign flip circuit arranged in series and further including a second output coupled to said Q signal input of the combined signal attenuator and sign flip module by a second attenuator and a second sign flip circuit; and a signal combiner including a first RF signal input and a second RF signal input coupled to the first and second signal outputs of said combined signal attenuator and sign flip module and having an RF signal output which serves as an output of the vector modulator based phase shifter.

While various features discussed in the summary are used in some embodiments it should be appreciated that not all features are required or necessary for all embodiments and the mention of features in the summary should in no way be interpreted as implying that the feature is necessary or critical for all embodiments. Numerous additional features and embodiments are discussed in the detailed description which follows.

BRIEF DESCRIPTION OF THE FIGURES

FIG. 8 is a drawing of a table mapping a plurality of alternative attenuation levels to control line settings in accordance with an exemplary embodiment.

DETAILED DESCRIPTION

Figure 1:
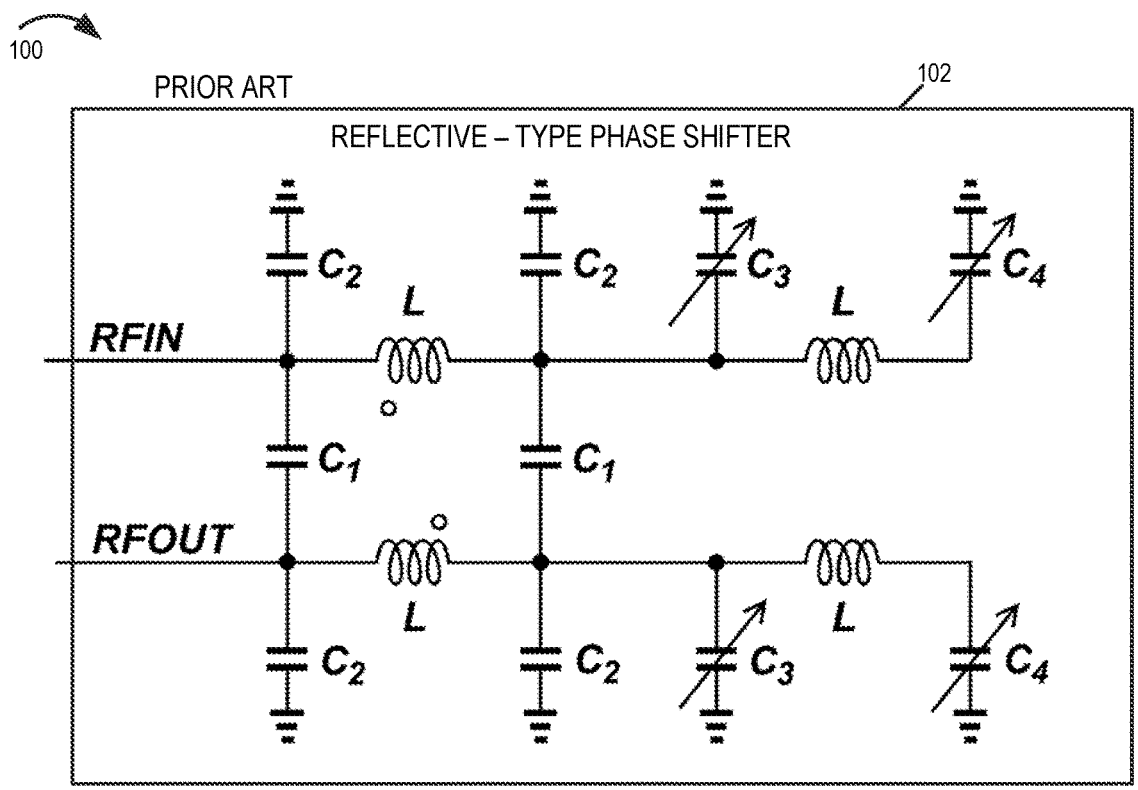
FIG. 1 includes a drawing illustrating a typical prior art passive phase shifter topology, namely the reflective-type phase shifter (RTPS), a corresponding phase vs frequency plot and a corresponding magnitude vs frequency plot.
Figure 1:
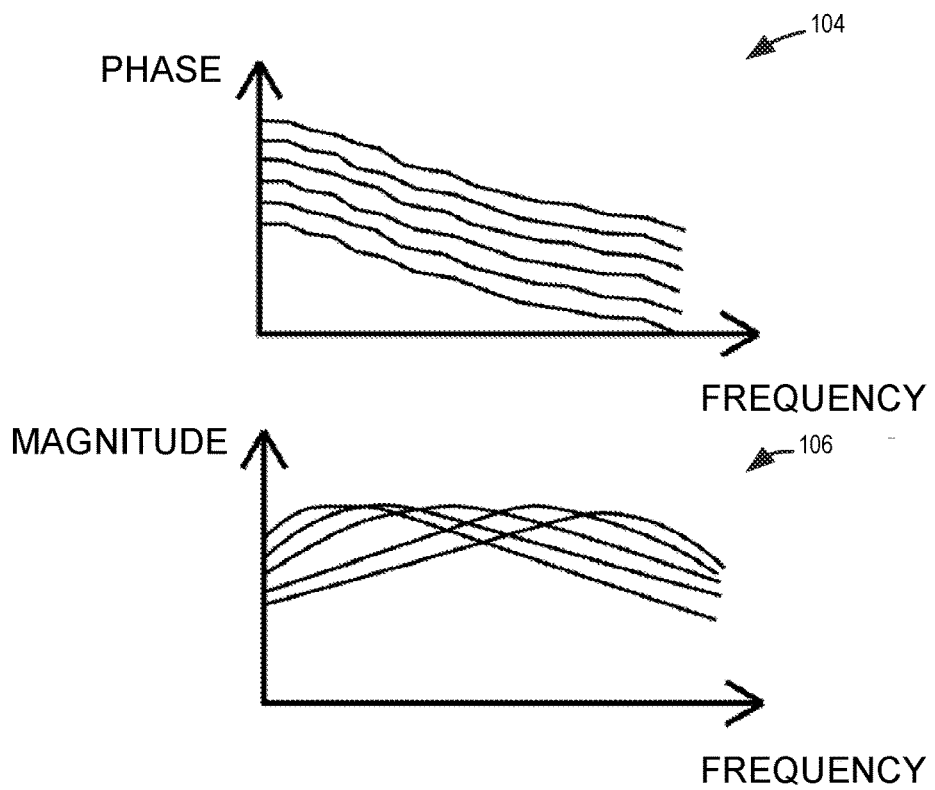
Figure 2:
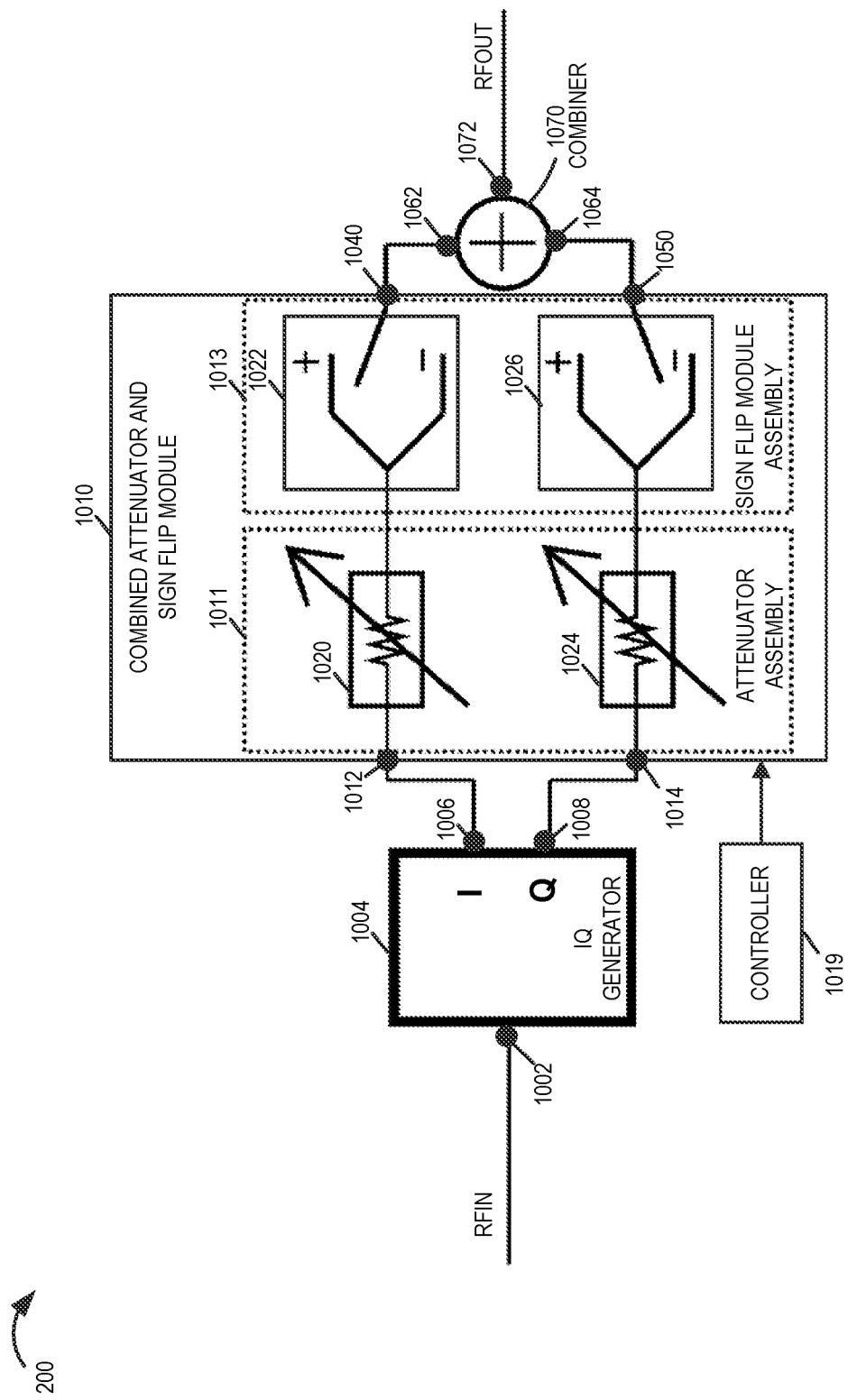
FIG. 2 is a drawing of an exemplary vector modulator based phase shifter, in which an attenuator assembly precedes a sign flip module assembly, in accordance with an exemplary embodiment.

FIG. 2 is a drawing of an exemplary vector modulator based phase shifter 200 in accordance with an exemplary embodiment. Vector modulator based phase shifter 200 includes an In-Phase and Quadrature (IQ) signal generator 1004, a combined attenuator and sign flip module 1010 and a signal combiner 1070 coupled together as shown in FIG. 2.

Exemplary vector modulator phase shifter 200 is an example of a novel phase shifter topology, referred to as a passive vector modulator topology. The passive vector modulator topology incorporates a passive IQ generator in series with a passive attenuator, to weight the I and Q signals, and a sign flip on each path to add a controllable 180 degree phase to each path. The signals are then added by a combiner. In this passive vector modulator topology, no reflective type circuits are used and it is naturally to be wideband or tunable wideband. Various alternative types of wideband generator, attenuator, sign flip and combiner can be, and sometimes are, used in this topology to form a wideband phase shifter.

IQ signal generator 1004 includes a radio frequency (RF) signal input 1002, an in-phase (I) signal output 1006 and a quadrature (Q) signal output 1008.

Combined attenuator and sign flip module 1010 includes an attenuator assembly 1011 and a sign flip module assembly 1013. The combined attenuator and sign flip module 1010 further includes an in-phase (I) signal input 1012, a quadrature (Q) signal input 1014, a first output 1040, and a second output 1050. Attenuator assembly 1011 includes a first attenuator 1020 and a second attenuator 1024. Sign flip module assembly 1013 includes a first sign flip module 1022 and a second sign flip module 1026.

The in-phase (I) signal input 1012 of the combined attenuator and sign flip module 1010 is coupled to the I signal output 1006 of the IQ signal generator 1004. The quadrature (Q) signal input 1014 of the combined attenuator and sign flip module 1010 is coupled to the quadrature (Q) signal output 1008 of the IQ signal generator 1004.

The first output 1040 of the combined signal attenuator and sign flip module 1010 is coupled to the I signal input 1012 of the combined signal attenuator and sign flip module 1010 by the first attenuator 1020 and the first sign flip circuit 1022 arranged in series. The second output 1050 of the combined signal attenuator and sign flip module 1010 is coupled to said Q signal input 1014 of the combined signal attenuator and sign flip module 1010 by the second attenuator 1024 and the second sign flip circuit 1026 arranged in series.

Signal combiner 1070 includes a first RF signal input 1062, a second RF signal input 1064, and a RF signal output 1072. The first RF signal input 1062 of the signal combiner 1070 is coupled to the first signal output 1040 of the combined signal attenuator and sign flip module 1010. The second RF signal input 1064 of the signal combiner 1070 is coupled to the second signal output 1050 of the combined signal attenuator and sign flip module 1010. The signal combiner 1072 combines signal received on first RF signal input 1062 with signal received on second RF signal input 1064 and outputs a generated combined signal on RF signal output 1072. The RF signal output 1072 serves as an output of the vector modulator based phase shifter 200.

In the exemplary vector modulator based phase shifter 200 of FIG. 2, the attenuator assembly 1011 precedes the sign flip module assembly 1013. The position of the attenuator assembly 1011 and the sign flip module assembly 1013 can be, and in some embodiments are, flipped. In the exemplary vector modulator based phase shifter 300 of FIG. 3, the sign flip module assembly 1013' precedes the attenuator assembly 1011'. Each component (e.g., the IQ generator, each attenuator in the attenuator assembly, each sign flip circuit in the sign flip module assembly, and the combiner) could be designed as a wideband component or a tunable component to cover a wide bandwidth.

Figure 3:
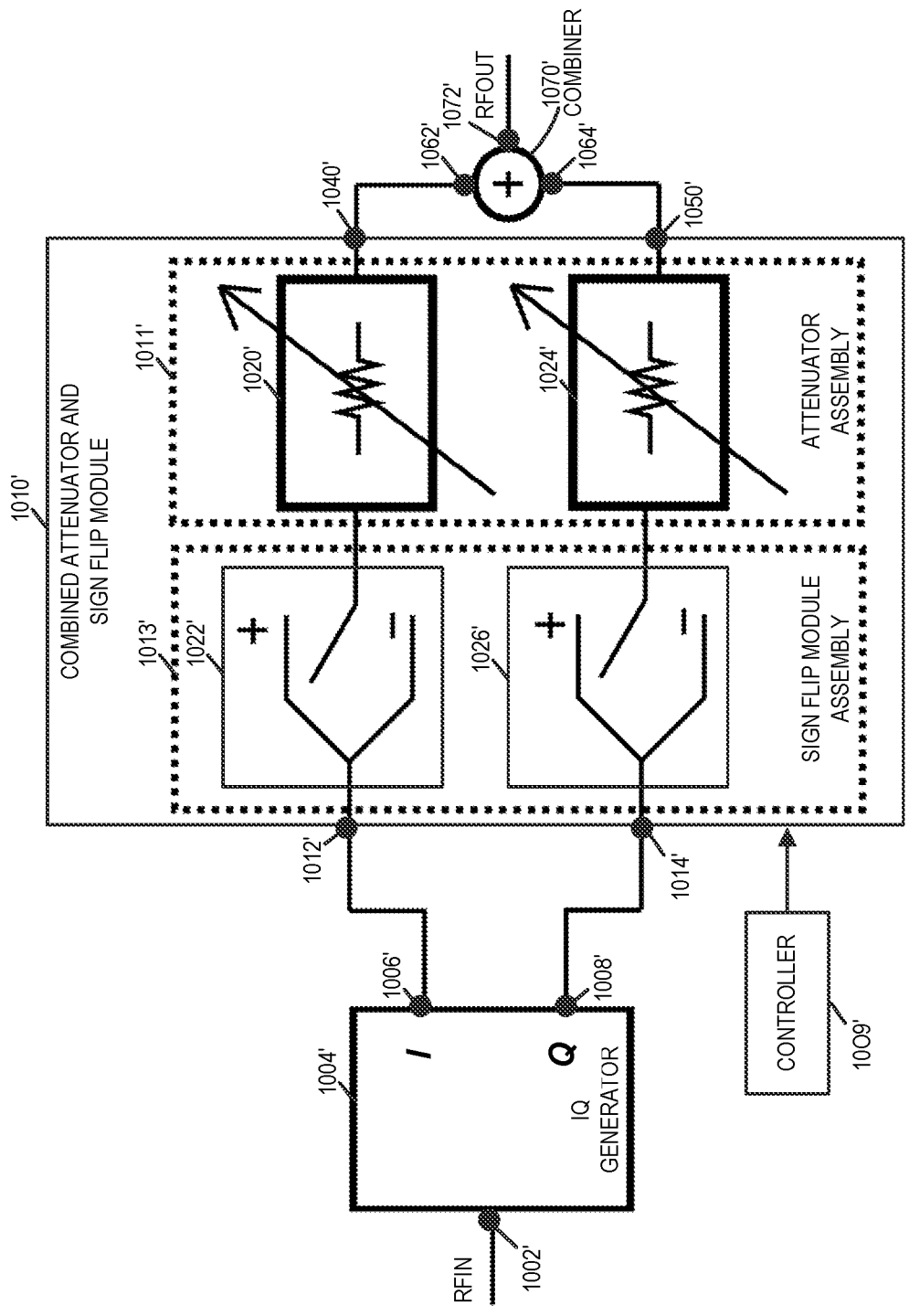
FIG. 3 is a drawing of an exemplary vector modulator based phase shifter, in which a sign flip module assembly precedes an attenuator assembly, in accordance with an exemplary embodiment.

FIG. 3 is a drawing of another exemplary vector modulator based phase shifter 300 in accordance with an exemplary embodiment. Vector modulator based phase shifter 300 includes an In-Phase and Quadrature (IQ) signal generator 1004', a combined attenuator and sign flip module 1010' and a signal combiner 1070' coupled together as shown in FIG. 3.

IQ signal generator 1004' includes a radio frequency (RF) signal input 1002', an in-phase (I) signal output 1006' and a quadrature (Q) signal output 1008'.

Combined attenuator and sign flip module 1010' includes a sign flip module assembly 1013' and an attenuator assembly 1011'. The combined attenuator and sign flip module 1010' further includes an in-phase (I) signal input 1012', a quadrature (Q) signal input 1014', a first output 1040', and a second output 1050'. Sign flip module assembly 1013' includes a first sign flip module 1022' and a second sign flip module 1026'. Attenuator assembly 1011' includes a first attenuator 1020' and a second attenuator 1024'.

The in-phase (I) signal input 1012' of the combined attenuator and sign flip module 1010' is coupled to the I signal output 1006' of the IQ signal generator 1004'. The quadrature (Q) signal input 1014' of the combined attenuator and sign flip module 1010' is coupled to the quadrature (Q) signal output 1008' of the IQ signal generator 1004'.

The first output 1040' of the combined signal attenuator and sign flip module 1010' is coupled to the I signal input 1012' of the combined signal attenuator and sign flip module 1010' by the first sign flip circuit 1022' and the first attenuator 1020' arranged in series. The second output 1050' of the combined signal attenuator and sign flip module 1010' is coupled to said Q signal input 1014' of the combined signal attenuator and sign flip module 1010' by the second sign flip circuit 1026' and the second attenuator 1024' arranged in series.

Signal combiner 1070' includes a first RF signal input 1062', a second RF signal input 1064', and a RF signal output 1072'. The first RF signal input 1062' of the signal combiner 1070' is coupled to the first signal output 1040' of the combined signal attenuator and sign flip module 1010'. The second RF signal input 1064' of the signal combiner 1070' is coupled to the second signal output 1050' of the combined signal attenuator and sign flip module 1010'. The signal combiner 1072' combines signal received on first RF signal input 1062' with signal received on second RF signal input 1064' and outputs a generated combined signal on RF signal output 1072'. The RF signal output 1072' serves as an output of the vector modulator based phase shifter 300.

In the vector modulator based phase shifter 200 of FIG. 2, within the combined attenuator and sign flip module 1010, the attenuator assembly 1011 precedes the sign flip module assembly 1013. However, in the vector modulator based phase shifter 300 of FIG. 3, within the combined attenuator and sign flip module 1010', the sign flip module assembly 1013' precedes the attenuator assembly 1011'. In some embodiments, the vector based phase shifter 200 of FIG. 2 is identical to the vector based phase shifter 300 of FIG. 3 with the exception of the order of the attenuator assembly and sign flip module assembly.

Figure 4:
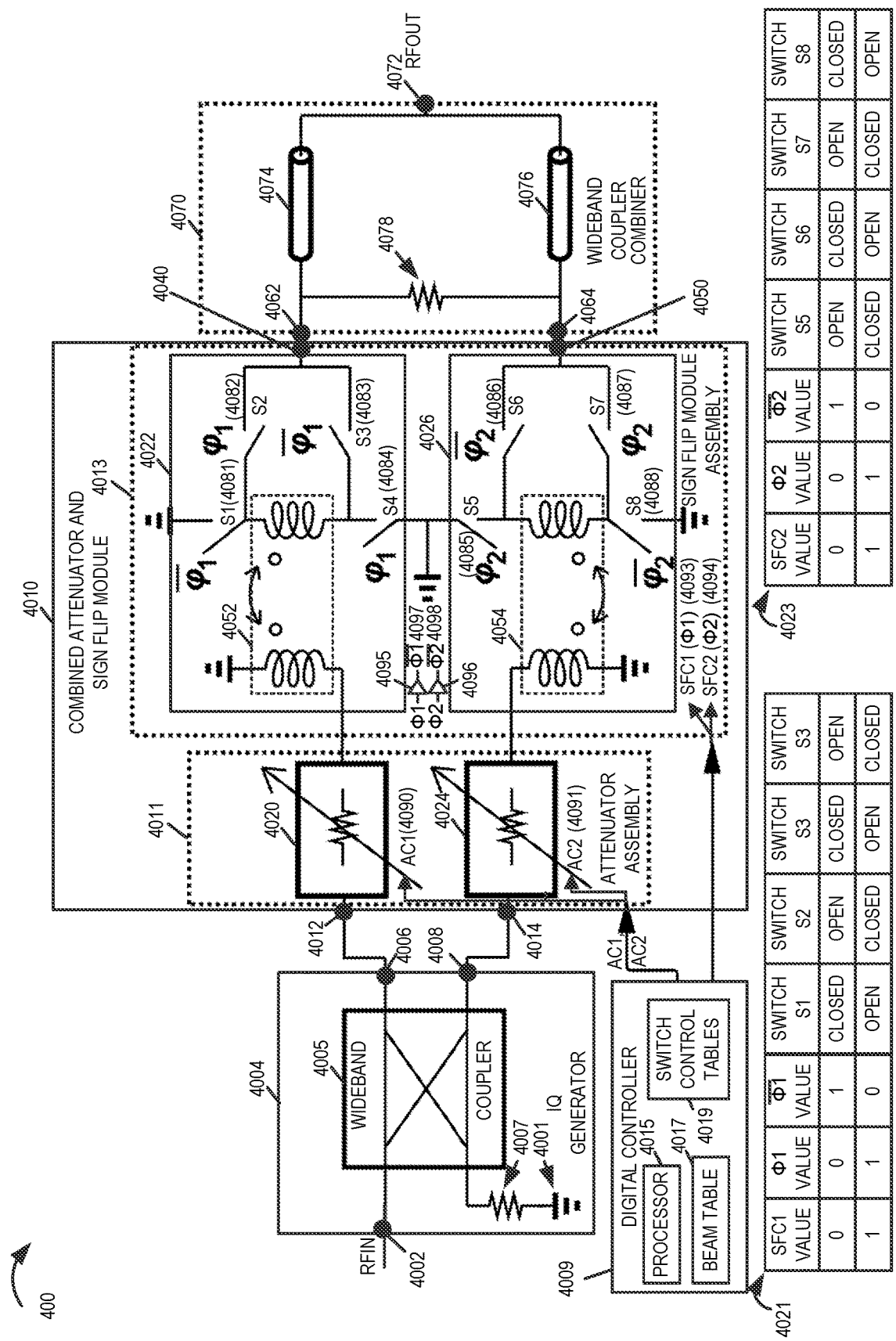
FIG. 4 is a drawing of an exemplary vector modulator based phase shifter, in which the sign flip module assembly is implemented using transformers and switches, in accordance with an exemplary embodiment.

FIG. 4 is a drawing of an exemplary vector modulator based phase shifter 400 in accordance with an exemplary embodiment. Vector modulator based phase shifter 400 includes an In-Phase and Quadrature (IQ) signal generator 4004, a combined attenuator and sign flip module 4010 and a signal combiner 4070 coupled together as shown in FIG. 4. Vector modulator based phase shifter 400 further includes digital controller 4009.

IQ signal generator 4004 includes a radio frequency (RF) signal input 4002, an in-phase (I) signal output 4006, and a quadrature (Q) signal output 4008. IQ signal generator 4004 is implemented using a wideband coupler 4005 and a resistor 4007 coupled together and to the signal input 4002, and to signal outputs 4006, 4008, and ground 4001 as shown in FIG. 4.

Combined attenuator and sign flip module 4010 includes an attenuator assembly 4011 and a sign flip module assembly 4013. The combined attenuator and sign flip module 4010 further includes an in-phase (I) signal input 4012, a quadrature (Q) signal input 4014, a first output 4040, and a second output 4050. Attenuator assembly 4011 includes a first attenuator 4020 and a second attenuator 4024. Sign flip module assembly 4013 includes a first sign flip module 4022, e.g., a first sign flip circuit, and a second sign flip module 4026, e.g., a second sign flip circuit.

First sign flip module 4022 includes a first transformer 4052 and four switches (S1 4081, S2 4082, S3 4083, S4 4084) coupled together and to other elements and ground as shown in FIG. 4. In this example, the sign flip of first sign flip circuit 4022 is designed by a tunable 1-bit controlled balun. Second sign flip module 4026 includes a second transformer 4054 and four switches (S5 4085, S6 4086, S7 4087, S8 4088) coupled together and to other elements and ground as shown in FIG. 4. In this example, the sign flip of second sign flip circuit 4026 is designed by a tunable 1-bit controlled balun.

Digital controller 4009 includes a processor 4015, e.g., a CPU, a beam table 4017, and control switch tables 4019. The beam table 4017 includes information identifying for each of different alternative beams, attenuator control settings for controlling the controllable variable attenuators 4020, 4024 and sign flip settings (phase settings) for the sign flip circuits. The control switch tables 4019 map sign flip control signals to switch positions. Tables 4021 and 4023 are examples of switch control tables 4019. The digital controller 4009 outputs attenuator control signals AC1 4090 and AC2 4092. Control signal AC1 4090 is used to set the value of first attenuator 4020. Control signal AC2 4091 is used to set the value of second attenuator 4024. The digital controller 4009 outputs sign flip control signals SFC1 4093 and SFC2 4093. Sign flip control signal SFC1 4093 is used to set the positions of switches S1 4081, S2 4082, S3 4083, and S4 4084 within sign flip circuit 1 4022, e.g., in accordance with table 4021. In this example, the value Φ1 is the same as the value of control signal SFC1 4093; and inverter 4095 generates the complementary value (inverted Φ1 4097). Sign flip control signal SFC2 4094 is used to set the positions of switches S5 4085, S6 4086, S7 4087, and S8 4088 within sign flip circuit 2 4026, e.g., in accordance with table 4023. In this example, the value Φ2 is the same as the value of control signal SFC2 4094; and inverter 4096 generates the complementary value (inverted Φ2 4098).

The in-phase (I) signal input 4012 of the combined attenuator and sign flip module 4010 is coupled to the I signal output 4006 of the IQ signal generator 4004. The quadrature (Q) signal input 4014 of the combined attenuator and sign flip module 4010 is coupled to the quadrature (Q) signal output 4008 of the IQ signal generator 4004.

The first output 4040 of the combined signal attenuator and sign flip module 4010 is coupled to the I signal input 4012 of the combined signal attenuator and sign flip module 4010 by the first attenuator 4020 and the first sign flip circuit 4022 arranged in series. The second output 4050 of the combined signal attenuator and sign flip module 4010 is coupled to said Q signal input 4014 of the combined signal attenuator and sign flip module 4010 by the second attenuator 4024 and the second sign flip circuit 4026 arranged in series.

Signal combiner 4070 includes a first RF signal input 4062, a second RF signal input 4064, and a RF signal output 4072. The first RF signal input 4062 of the signal combiner 4070 is coupled to the first signal output 4040 of the combined signal attenuator and sign flip module 4010. The second RF signal input 4064 of the signal combiner 4070 is coupled to the second signal output 4050 of the combined signal attenuator and sign flip module 4010. The signal combiner 4072 combines signal received on first RF signal input 4062 with signal received on second RF signal input 4064 and outputs a generated combined signal on RF signal output 4072. Signal combiner 4070 is implemented using a resistor 4078 and two transmission lines 4074, 4076 coupled together as shown. The RF signal output 4072 serves as an output of the vector modulator based phase shifter 400.

Figure 5:
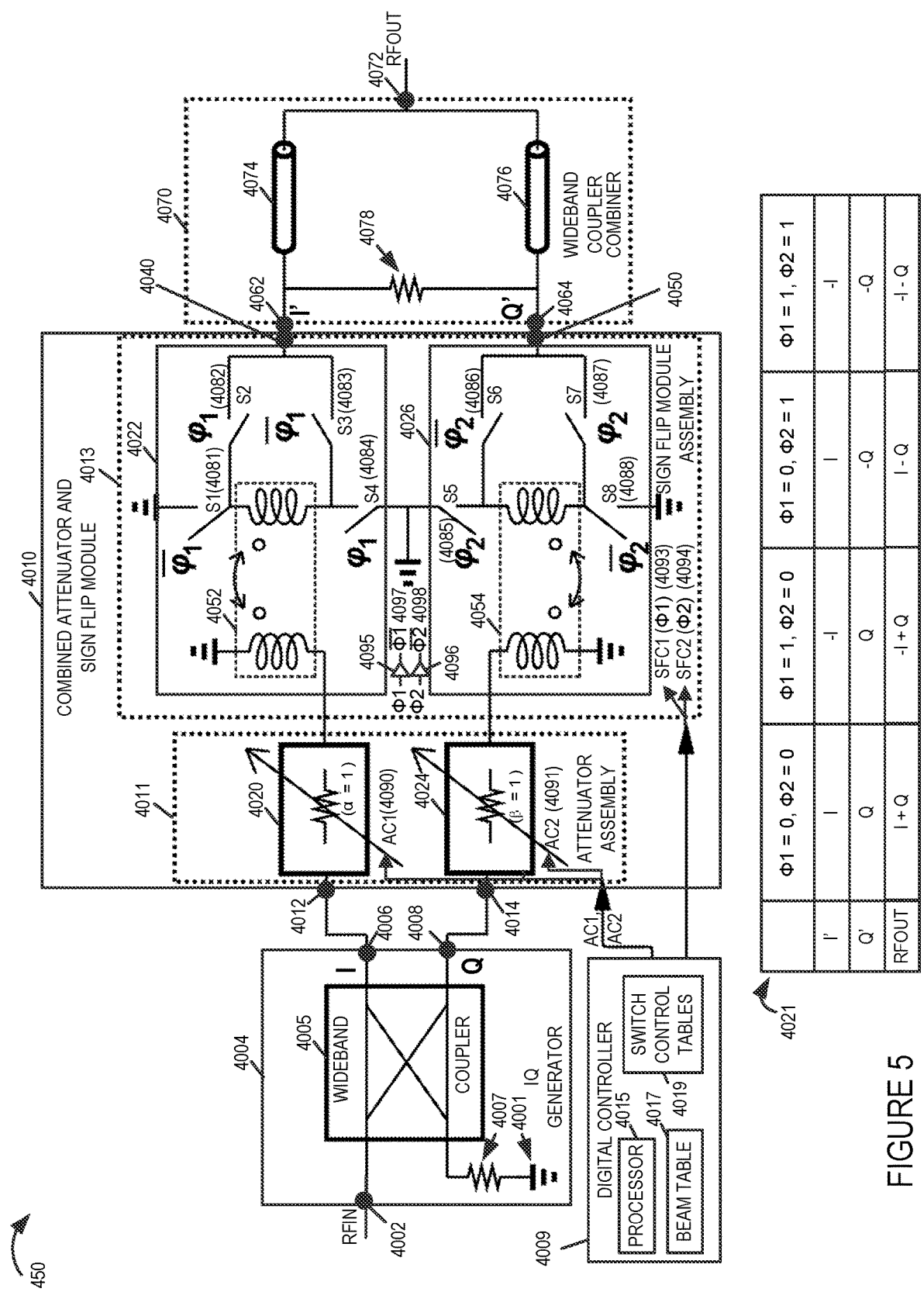
FIG. 5 includes a drawing illustrating the exemplary vector modulator based phase shifter of FIG. 4 for an example in which the attenuator gains are set to 1 and further includes a signal table used to illustrate the sign flip control in accordance with an exemplary embodiment.

FIG. 5 includes a drawing 450 illustrating the exemplary vector modulator based phase shifter 400 of FIG. 4 for an example in which the attenuator gains are set to 1 and further includes a signal table 4021 used to illustrate the sign flip control in accordance with an exemplary embodiment. The output of wideband coupler 4005 are I and Q signals. The function of attenuator is to provide a coefficient the makes the output of the attenuator to be $\alpha*I+\beta*Q$, where $0<=\alpha$, $\beta<=1$. In the example of FIG. 5, $\alpha=1$ and $\beta=1$. The function of the switches is to change the signal of I and Q signals as listed in the table 4021. In the table 4021, 90 degrees common phase shift from the wideband combiner 4070 is not counted in RFOUT result.

Table 4021 illustrates that when Φ1=0 and Φ2=0 (switches S1 4081, S3 4083, S6 4086, S8 4088 are controlled to be closed, and switches S2 4082, S4 4084, S5 4085, S7 4087 are controlled to be open), then I'=I, Q'=Q, and RFOUT=I+Q. Table 4021 further illustrates that when Φ1=1 and Φ2=0 (switches S2 4082, S4 4084, S6 4086, S8 4088 are controlled to be closed, and switches S1 4081, S3 4083, S5 4085, S7 4087 are controlled to be open), then I'=−I, Q'=Q, and RFOUT=−I+Q. Table 4021 further illustrates that when Φ1=0 and Φ2=1 (switches S1 4081, S3 4083, S5 4085, S7 4087 are controlled to be closed, and switches S2 4082, S4 4084, S6 4086, S8 4088 are controlled to be open), then I'=I, Q'=−Q, and RFOUT=I−Q. Table 4021 further illustrates that when Φ1=1 and Φ2=1 (switches S2 4082, S4 4084, S5 4085, S7 4087 are controlled to be closed, and switches S1 4081, S3 4083, S6 4086, S8 4088 are controlled to be open), then I'=−I, Q'=−Q, and RFOUT=−I−Q.

Figure 6:
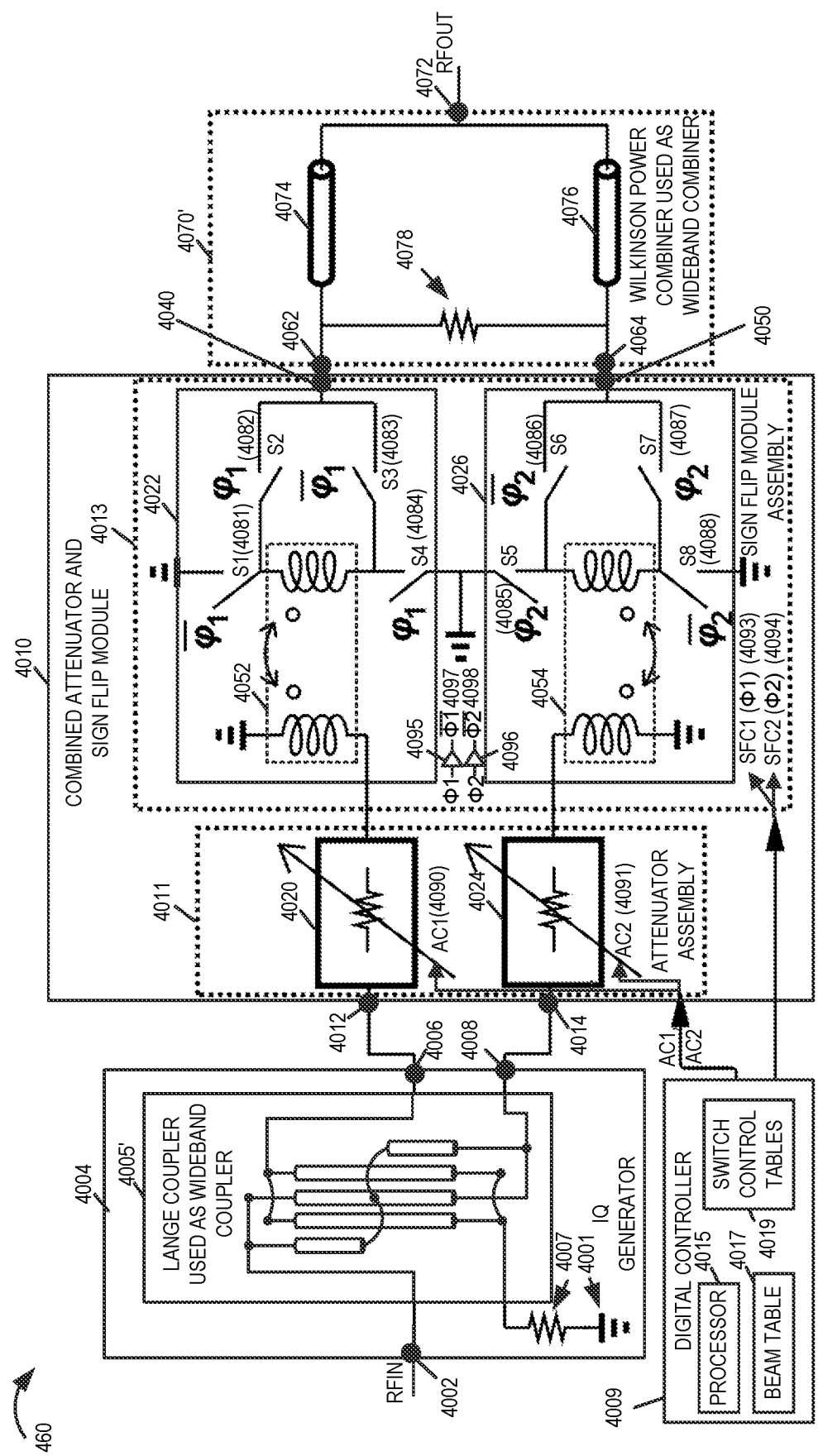
FIG. 6 is a drawing of an exemplary vector modulator based phase shifter, which is an exemplary design example of the vector modulator based phase shifter of FIG. 4, in which a Lange coupler is used as the wideband coupler of the IQ generator, switched transformer circuits are used to implement the sign flip circuits and a Wilkinson power combiner is used as the wideband combiner, in accordance with an exemplary embodiment.

FIG. 6 is drawing an exemplary vector modulator based phase shifter 460 in accordance with an exemplary embodiment. Vector modulator based phase shifter 460 is an exemplary design example of the vector modulator based phase shifter 400 of FIG. 4, in which the a Lange coupler 4005' is used as the wideband coupler 4005 of the IQ generator 4004, switched transformer circuits are used to implement the sign flip circuits (4022, 4026) and a Wilkinson power combiner 4070' is used as the wideband combiner 4070.

Figure 7:
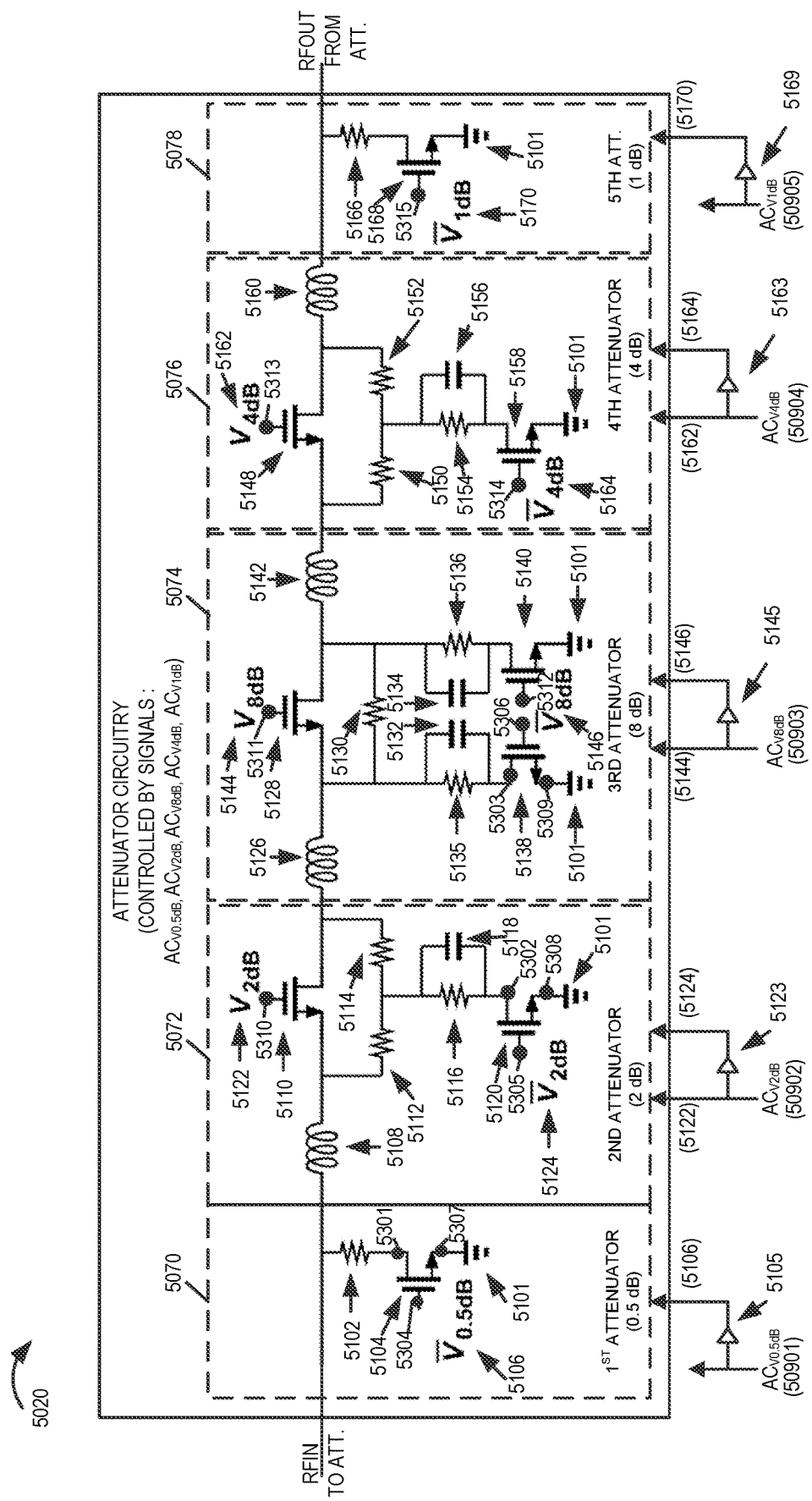
FIG. 7 is a drawing of exemplary attenuator circuitry in accordance with an exemplary embodiment.

FIG. 7 is a drawing of exemplary attenuator circuitry 5020 in accordance with an exemplary embodiment. Exemplary attenuator circuitry 5020 is an example of a wide band attenuator designed for operation across 24-29 GHz. Exemplary attenuator circuitry 5020 is, e.g. any of the attenuators: first attenuator 1020 of FIG. 2, second attenuator 1024 of FIG. 2, first attenuator 1020' of FIG. 3, second attenuator 1024' of FIG. 3, first attenuator 4020 of FIG. 4, second attenuator 4024 of FIG. 4, first attenuator 7020 of FIG. 9, second attenuator 7024 of FIG. 9.

Attenuator circuitry 5020 includes a first attenuator 5070, which is a 0.5 dB attenuator, a second attenuator 5072, which is a 2 dB attenuator, a third attenuator 5074, which is an 8 dB attenuator, a fourth attenuator 5076, which is a 4 dB attenuator, and a fifth attenuator 5078, which is a 1 dB attenuator.

The first attenuator 5070, which is the 0.5 dB attenuator, includes a resistor 5102, and a FET 5104 coupled together, to ground 5101 and to a control signal 5106, as shown. FET 5104 includes a first terminal (drain) 5301, a control input (gate) 5304 and a third terminal (source) 5307.

The second attenuator 5072, which is the 2 dB attenuator, includes three resistors 5112, 5114, 5116, two FETs 5110, 5120, an inductor 5108, and a capacitor 5118 coupled together, to ground 5101 and to a control signals 5122, 5124, as shown. FET 5110 includes a first terminal (drain), a control input (gate) 5310 and a third terminal (source). FET 5120 includes a first terminal (drain) 5302, a control input (gate) 5305 and a third terminal (source) 5308.

The third attenuator 5074, which is the 8 dB attenuator, includes three resistors 5130, 5135, 5136, three FETs 5128, 5138, 5140, two inductor 5126, 5142 and two capacitors 5132, 5134 coupled together, to ground 5101 and to a control signals 5144, 5146, as shown. FET 5128 includes a first terminal (drain), a control input (gate) 5311 and a third terminal (source). FET 5138 includes a first terminal (drain) 5303, a control input (gate) 5306 and a third terminal (source) 5309. FET 5140 includes a first terminal (drain), a control input (gate) 5312 and a third terminal (source).

The fourth attenuator 5076, which is the 4 dB attenuator, includes three resistors 5150, 5152, 5154, two FETs 5148, 5158, an inductor 5160, and a capacitor 5156 coupled together, to ground 5101 and to a control signals 5162, 5164, as shown. FET 5148 includes a first terminal (drain), a control input (gate) 5313 and a third terminal (source). FET 5158 includes a first terminal (drain), a control input (gate) 5314 and a third terminal (source).

The fifth attenuator 5078, which is the 1 dB attenuator, includes a resistor 5166, and a FET 5168 coupled together, to ground 5101 and to a control signal 5170, as shown. FET 5168 includes a first terminal (drain), a control input (gate) 5315 and a third terminal (source).

In an exemplary embodiment, when control signal 5106 is set to a logic 1, the first attenuator 5070 attenuates a received signal by 0.5 dBs, and when control signal 5106 is set to a logic 0, the first attenuator 5070 does not attenuate the received input signal. When control signal 5106 is set to a logic 1 FET 5104 is controlled to operate as a closed switch. When control signal 5106 is set to a logic 0 FET 5304 is controlled to operate as an open switch.

In an exemplary embodiment, when control signal 5122 is set to a logic 0 and control signal 5124 is set to logic 1, the second attenuator 5072 attenuates a received signal by 2 dBs, and when control signal 5122 is set to a logic 1 and control signal 5124 is set to logic 0, the second attenuator 5072 does not attenuate the received input signal. When control signal 5122 is set to a logic 1 FET 5110 is controlled to operate as a closed switch. When control signal 5122 is set to a logic 0 FET 5110 is controlled to operate as an open switch. When control signal 5124 is set to a logic 1 FET 5120 is controlled to operate as a closed switch. When control signal 5124 is set to a logic 0 FET 5120 is controlled to operate as an open switch.

In an exemplary embodiment, when control signal 5144 is set to a logic 0 and control signal 5146 is set to logic 1, the third attenuator 5074 attenuates a received signal by 8 dBs, and when control signal 5144 is set to a logic 1 and control signal 5146 is set to logic 0, the third attenuator 5074 does not attenuate the received input signal. When control signal 5144 is set to a logic 1 FET 5128 is controlled to operate as a closed switch. When control signal 5144 is set to a logic 0 FET 5128 is controlled to operate as an open switch. When control signal 5146 is set to a logic 1 FET 5138 and FET 5140 are controlled to operate as closed switches. When control signal 5146 is set to a logic 0 FET 5138 and FET 5140 are controlled to operate as open switches.

In an exemplary embodiment, when control signal 5162 is set to a logic 0 and control signal 5164 is set to logic 1, the fourth attenuator 5076 attenuates a received signal by 4 dBs, and when control signal 5162 is set to a logic 1 and control signal 5164 is set to logic 0, the fourth attenuator 5076 does not attenuate the received input signal. When control signal 5162 is set to a logic 1 FET 5148 is controlled to operate as a closed switch. When control signal 5162 is set to a logic 0 FET 5148 is controlled to operate as an open switch. When control signal 5164 is set to a logic 1 FET 5158 is controlled to operate as a closed switch. When control signal 5164 is set to a logic 0 FET 5158 is controlled to operate as an open switch.

In an exemplary embodiment, when control signal 5170 is set to a logic 1, the fifth attenuator 5078 attenuates a received signal by 1 dB, and when control signal 5170 is set to a logic 0, the fifth attenuator 5078 does not attenuate the received input signal. When control signal 5170 is set to a logic 1 FET 5168 is controlled to operate as a closed switch. When control signal 5170 is set to a logic 0 FET 5168 is controlled to operate as an open switch.

FIG. 7 further illustrates exemplary control signals (ACV0.5 dB 50901, ACV2 dB 50902, ACV8 dB 50903, ACV04 dB 50904, ACV1 dB 50905), e.g., received from a controller, exemplary inverters 5105, 5123, 5145, 5163, 5169, coupled together and to the attenuators (5070, 5072, 5074, 5078, 5078) as shown. The controller which generated the control signals (ACV0.5 dB 50901, ACV2 dB 50902, ACV8 dB 50903, ACV04 dB 50904, ACV1 dB 50905), is, e.g., controller 1009 of FIG. 2, controller 1009' of FIG. 2, controller 4009 of FIG. 4 or controller 7009 of FIG. 9.

Figure 9:
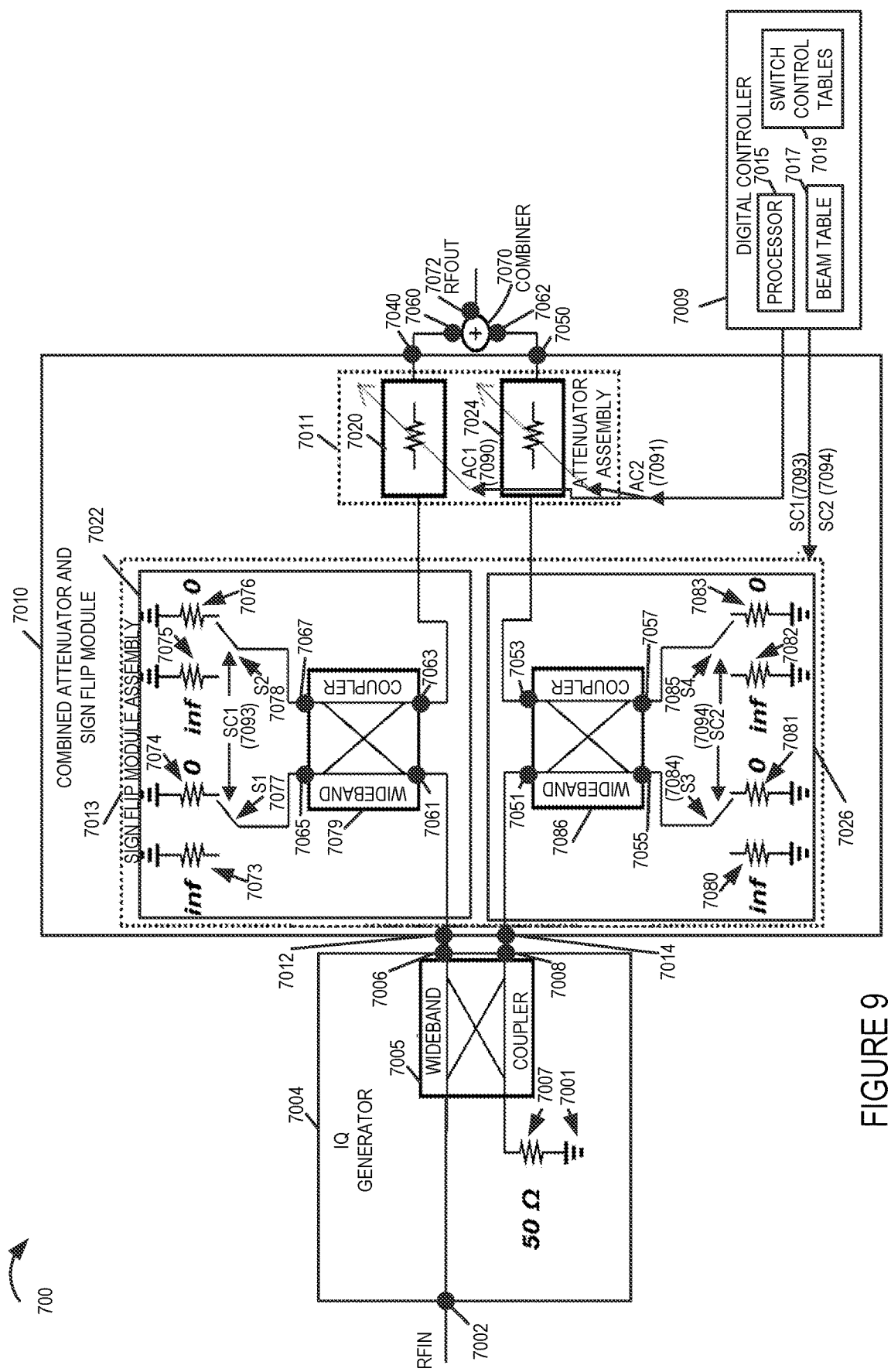
FIG. 9 is a drawing of an exemplary vector modulator based phase shifter, in which the sign flip module assembly is implemented using wideband couplers and switches which select between resistances, in accordance with an exemplary embodiment.

The set of control signals (ACV0.5 dB 50901, ACV2 dB 50902, ACV8 dB 50903, ACV04 dB 50904, ACV1 dB 50905) is, e.g., a set of AC1 signals 4090 used to control first attenuator 4020 of FIG. 4, a set of AC2 signals 4092 used to control second attenuator 4024, a set of AC1 signals 7090 used to control first attenuator 7020 of FIG. 9, or a set of AC2 signals 7092 used to control second attenuator 7024 of FIG. 9.

In some embodiments, the FETs (5104, 5110, 5120, 5128, 5138, 5140, 5148. 5158, 5168) are NFETs, e.g., NMOS FETs. In this case when gate voltage equals 1, the NFET is on (switch closed), and when the gate voltage is 0, the NFET is off (switch open). Switch closed means closed path between drain and source of the NFET. Switch open means open path between drain and source of NFET.

FIG. 8 is a drawing of a table 6000 mapping a plurality of alternative attenuation levels to control line settings in accordance with an exemplary embodiment. In one exemplary embodiment table 6000 is used, e.g. by a controller, in controlling the attenuator circuitry 5020 of FIG. 7. First column 6002 lists attenuation. Second column 6004 lists the control line ACV0.5 dB setting for each of 32 different attenuation selections for the 0.5 dB attenuator 5070. Third column 6006 lists the control line ACV2 dB setting for each of 32 different attenuation selections for the 2 dB attenuator 5072. Fourth column 6006 lists the control line ACV8 dB setting for each of 32 different attenuation selections for the 8 dB attenuator 5074. Fifth column 6008 lists the control line ACV4 dB setting for each of 32 different attenuation selections for the 4 dB attenuator 5076. Sixth column 6012 lists the control line ACV1 dB setting for each of 32 different attenuation selections for the 1 dB attenuator 5078.

FIG. 9 is a drawing of an exemplary vector modulator based phase shifter 700, in which the sign flip module assembly 7013 is implemented using wideband couplers (7079, 7086) and switches (7077, 7078, 7084, 7085) which select between resistances, e.g., between 0 ohms (or a relatively low resistance) and infinite ohms (or a relatively high resistance), in accordance with an exemplary embodiment. In some embodiments, a zero ohms resistance is used to represent a short circuit (or a very low resistance path to ground) and an infinite ohms resistance is used to represent an open circuit (or a very high resistance path to ground).

The design of FIG. 9 is an example of wideband without tuning (e.g., within the sign module flip assembly 7013). Each sign flip circuit (7022, 7026) in sign flip module assembly 7013 is designed with a wideband coupler (7079, 7086) which could terminate either to ground (7001) of infinite high impedance to choose the quadrant of the vector.

Vector modulator based phase shifter 700 includes an In-Phase and Quadrature (IQ) signal generator 7004, a combined attenuator and sign flip module 7010 and a signal combiner 7070 coupled together as shown in FIG. 9. Vector modulator based phase shifter 700 further includes digital controller 7009.

IQ signal generator 7004 includes a radio frequency (RF) signal input 7002, an in-phase (I) signal output 7006, and a quadrature (Q) signal output 7008. IQ signal generator 7004 is implemented using a wideband coupler 7005 and a 50 ohm resistor 7007 coupled together and to the signal input 7002, and to signal outputs 7006, 7008, and ground 7001 as shown in FIG. 9.

Combined attenuator and sign flip module 7010 includes a sign flip module assembly 7013 and an attenuator assembly 7011. The combined attenuator and sign flip module 7010 further includes an in-phase (I) signal input 7012, a quadrature (Q) signal input 7014, a first output 7040, and a second output 7050. Sign flip module assembly 7013 includes a first sign flip module 7022 and a second sign flip module 7026.

Attenuator assembly 7011 includes a first attenuator 7020 and a second attenuator 7024.

First sign flip module 7022 includes a wideband coupler 7079 and two switches (S1 7077, S2 7078), which are ganged, two infinite resistances (7073, 7075) and two 0 ohm resistances (7074, 7076), coupled together and to other elements and to ground 7001 as shown in FIG. 9. In a first switch position, via control signal SC1 7093 (e.g., set to value=0) the switches (7077, 7078) are controlled to couple the wideband coupler 7079 to ground 7001 via the 0 ohm resistances (7074, 7076). In a second switch position, via control signal SC1 7093 (e.g., set to value=1) the switches (7077, 7078) are controlled to couple the wideband coupler 7079 to the infinite ohm resistances (7073, 7075).

The first sign flip circuit (7022) is implemented using a wideband coupler (7079) having first and second pairs of terminals, the first terminal (7061) of the first pair of terminals serving as an input and the second terminal (7063) of the first pair of terminals serving as an output of the first sign flip circuit (7022), the first terminal (7065) of the second pair of terminals being coupled to a first switch (7077) to ground (7001) (e.g., via a short (7074) or low resistance path) or a high impendence (7073) depending on the position of the first switch (7077), the second terminal (7067) of the second pair of terminals being coupled by a second switch (7078) to ground (7001) (e.g., via a short (7076) or low resistance path) or a high impendence (7075) depending on the position of the second switch (7078), said first and second switches (7077, 7078) being controlled by a control signal (SC1 7093) supplied to said first sign flip circuit (7022).

Second sign flip module 7026 includes a wideband coupler 7086 and two switches (S3 7084, S4 7085), which are ganged, two infinite resistances (7080, 7082) and two 0 ohm resistances (7081, 7083), coupled together and to other elements and to ground 7001 as shown in FIG. 7. In a first switch position, via control signal SC2 7094 (e.g., set to value=0) the switches (7084, 7085) are controlled to couple the wideband coupler 7086 to ground 7001 via the 0 ohm resistances (7081, 7083). In a second switch position, via control signal SC2 7094 (e.g., set to value=1) the switches (7084, 7085) are controlled to couple the wideband coupler 7086 to the infinite ohm resistances (7080, 7082).

The second sign flip circuit (7026) is implemented using a wideband coupler (7086) having first and second pairs of terminals, the first terminal (7051) of the first pair of terminals serving as an input and the second terminal (7053) of the first pair of terminals serving as an output of the second sign flip circuit (7026), the first terminal (7055) of the second pair of terminals being coupled to a third switch (7084) to ground (7001) (e.g., via a short (7081) or low resistance path) or a high impendence (7080) depending on the position of the third switch (7084), the second terminal (7057) of the second pair of terminals being coupled by a fourth switch (7085) to ground (7001) (e.g., via a short (7083) or low resistance path) or a high impendence (7082) depending on the position of the fourth switch (7085), said third and fourth switches (7084, 7085) being controlled by a control signal (SC2 7094) supplied to said second sign flip circuit (7026).

Digital controller 7009 includes a processor 7015, e.g. a CPU, a beam table 7017, and control switch tables 7019. The beam table 7015 includes information identifying for each of different alternative beams, attenuator control settings for controlling the controllable variable attenuators 7020, 7024 and sign flip settings (phase settings) for the sign flip circuits. The control switch tables 7019 map sign flip control signals to switch positions. The digital controller 7009 outputs attenuator control signals AC1 7090 and AC2 7092. Control signal AC1 7090 is used to set the value of first attenuator 7020. Control signal AC2 7091 is used to set the value of second attenuator 7024. The digital controller 7009 outputs sign flip control signals SFC1 7093 and SFC2 7093. Sign flip control signal SFC1 7093 is used to set the positions of switches S1 7077 and S2 7078 within sign flip circuit 1 7022. Sign flip control signal SFC2 7094 is used to set the positions of switches S3 7084, S4 7085 within sign flip circuit 2 7026.

The in-phase (I) signal input 7012 of the combined attenuator and sign flip module 7010 is coupled to the I signal output 7006 of the IQ signal generator 7004. The quadrature (Q) signal input 7014 of the combined attenuator and sign flip module 7010 is coupled to the quadrature (Q) signal output 7008 of the IQ signal generator 7004.

The first output 7040 of the combined signal attenuator and sign flip module 7010 is coupled to the I signal input 7012 of the combined signal attenuator and sign flip module 7010 by the first sign flip circuit 7022 and the first attenuator 7020 arranged in series. The second output 7050 of the combined signal attenuator and sign flip module 7010 is coupled to said Q signal input 7014 of the combined signal attenuator and sign flip module 7010 by the second sign flip circuit 7026 and the second attenuator 7024 and arranged in series.

Signal combiner 7070 includes a first RF signal input 7062, a second RF signal input 7064, and a RF signal output 7072. The first RF signal input 7062 of the signal combiner 7070 is coupled to the first signal output 7040 of the combined signal attenuator and sign flip module 7010. The second RF signal input 7064 of the signal combiner 7070 is coupled to the second signal output 7050 of the combined signal attenuator and sign flip module 7010. The signal combiner 7072 combines signal received on first RF signal input 7062 with signal received on second RF signal input 7064 and outputs a generated combined signal on RF signal output 7072. The RF signal output 7072 serves as an output of the vector modulator based phase shifter 700.

Figure 10:
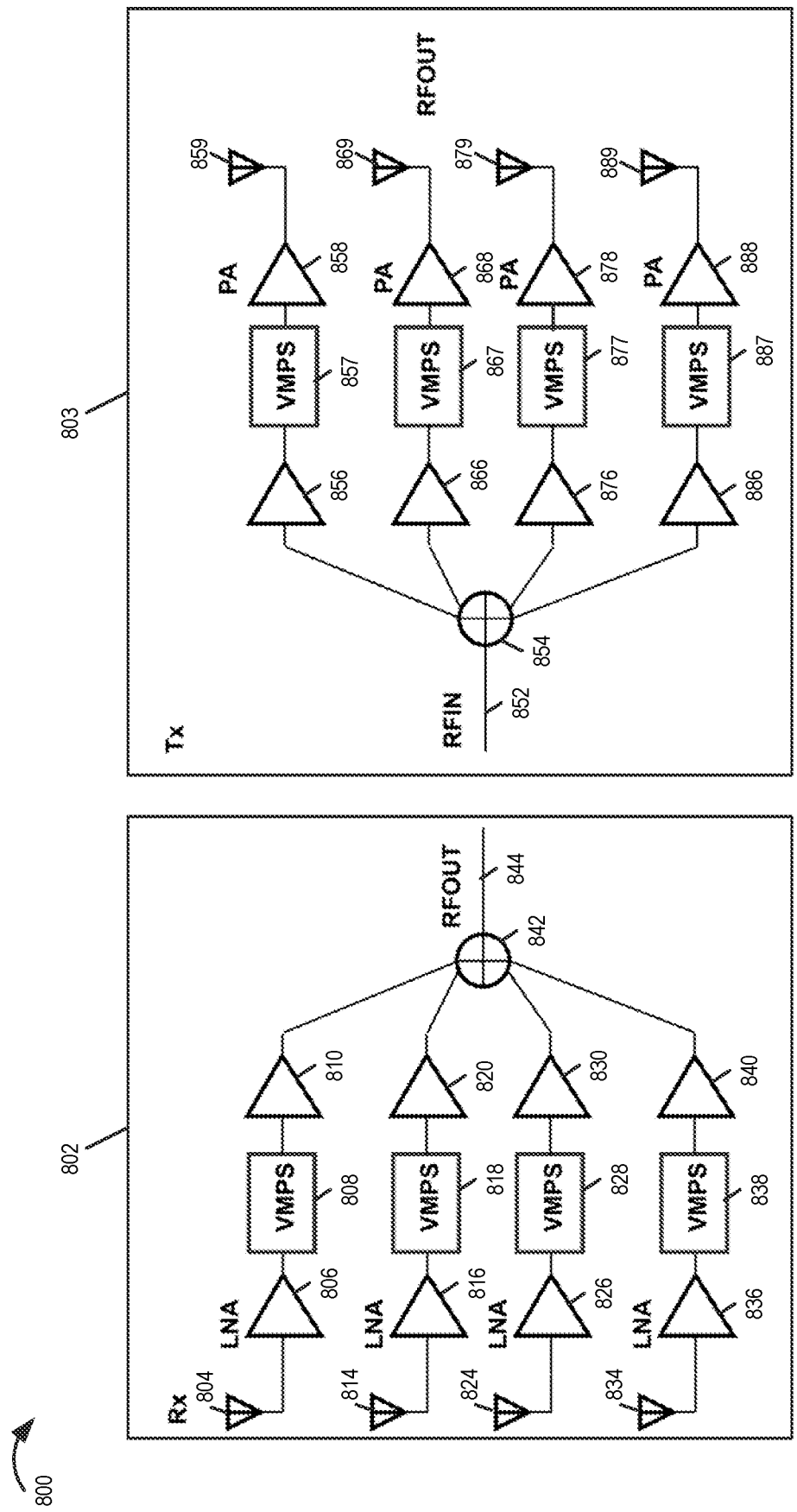
FIG. 10 is a drawing illustrating the position of vector modulator based phase shifters in exemplary phased arrays in accordance with an exemplary embodiment.

FIG. 10 is a drawing 800 illustrating the position of vector modulator based phase shifters in exemplary phased arrays in accordance with an exemplary embodiment. Exemplary receiver (RX) 802 includes a plurality of receive antennas (804, 814, 824, 834), a plurality of low noise amplifiers (LNAs) (806, 816, 826, 836), a plurality of vector modulator phase shifters (VMPSs) (808, 818, 828, 838), a plurality of amplifiers (810, 820, 830, 840) and combiner 842 coupled together as shown. The output of the combiner 842 is RFOUT signal 844. In each receive chain, a VMPS is positioned between a LNA and an amplifier.

Exemplary transmitter 803 includes a splitter 854, which receives RFIN signal 852, a plurality of amplifiers (856, 866, 876, 886), a plurality of vector modulator phase shifters (VMPSs) (857, 867, 877, 887), a plurality of power amplifiers (PAs) (858, 868, 878, 888) and a plurality of transmit antennas (859, 869, 879, 889) coupled together as shown. In each transmit chain, a VMPS is positioned between an amplifier and an power amplifier.

The VMPSs (808, 818, 828, 838, 857, 867, 877, 887) shown in FIG. 10 are, e.g., any of the vector modulator based phase shifters shown in FIGS. 2-9 and/or a vector modulator based phase shifter including one or more of the features shown in FIGS. 2-9.

Numbered List of Exemplary Apparatus Embodiments

Apparatus Embodiment 1. A vector modulator based phase shifter (200, 300, 400, or 700) comprising: an In-phase and Quadrature phase (IQ) signal generator (1004) including a radio frequency (RF) signal input (1002), an in-phase (I) signal output (1006) and a quadrature (Q) signal output (1008); a combined signal attenuator and sign flip module (1010) having an in-phase (I) signal input (1012) coupled to the I signal output (1006) of the IQ signal generator (1004) and having a quadrature (Q) signal input (1014) coupled to a quadrature (Q) signal output (1008) of the IQ signal generator (1004), said combined signal attenuator and sign flip module (1010) including a first output (1040) coupled to said I signal input (1012) of the combined signal attenuator and sign flip module (1010) by a first attenuator (1020) and a first sign flip circuit (1022) arranged in series and further including a second output (1050) coupled to said Q signal input (1014) of the combined signal attenuator and sign flip module (1010) by a second attenuator (1024) and a second sign flip circuit (1026); and a signal combiner (1070) including a first RF signal input (1062) and a second RF signal input (1064) coupled to the first and second signal outputs (1040, 1050) of said combined signal attenuator and sign flip module (1010) and having an RF signal output (1072) which serves as an output of the vector modulator based phase shifter.

Apparatus Embodiment 2. The vector modulator based phase shifter (200, 300, 400, or 700) of Apparatus Embodiment 1, wherein the vector modulator is a passive device which applies signal attenuation without applying any positive signal gain to signals passing through the vector modulator based phase shifter.

Apparatus Embodiment 2A. The vector modulator based phase shifter (200, 300, 400, or 700) of Apparatus Embodiment 2, wherein the vector modulator based phase shifter is a wideband device. (In antenna system, larger than 20% fractional bandwidth is usually considered as wideband.)

Apparatus Embodiment 2B. The vector modulator based phase shifter (200, 300, 400, or 700) of Apparatus Embodiment 2, wherein the vector modulator based phase shifter is a wideband device supporting a frequency range from 24 GHz to 29.5 GHz. (The fractional bandwidth is larger than 20%. In antenna system, larger than 20% fractional bandwidth is usually considered as wideband.).

Apparatus Embodiment 2C. The vector modulator based phase shifter (200, 300, 400, or 700) of Apparatus Embodiment 2, wherein the vector modulator based phase shifter is a wideband device supporting a frequency range of at least 5 GHz.

Apparatus Embodiment 3. The vector modulator based phase shifter (200, 300, 400, or 700) of Apparatus Embodiment 2, wherein the vector modulator based phase shifter is a bidirectional device with the RF signal output (1072) operating as a RF signal input when a RF signal is applied to the RF signal output (1072) and with the RF signal input (1002) operating as a signal output when a RF signal is applied to the signal output (1072).

Apparatus Embodiment 4. The vector modulator based phase shifter (200 or 400) of Apparatus Embodiment 2, wherein the first attenuator (1020) precedes said first sign flip circuit (1022) in said series connection extending between the I signal input (1012) of the combined attenuator and sign flip module (1010) and the first output (1040) of the combined attenuator and sign flip module (1010); and wherein the second attenuator (1024) precedes said second sign flip circuit (1026) in said series connection extending between the Q signal input (1014) of the combined attenuator and sign flip module (1010) and the second output (1050) of the combined attenuator and sign flip module (1010).

Apparatus Embodiment 5. The vector modulator vector based phase shifter (300 or 700) of Method Embodiment 2, wherein the first attenuator (1020') follows said first sign flip circuit (1022') in said series connection extending between the I signal input (1012') of the combined attenuator and sign flip module (1010') and the first output (1040') of the combined attenuator and sign flip module (1010'); and wherein the second attenuator (1024') follows said second sign flip circuit (1026') in said series connection extending between the Q signal input (1014') of the combined attenuator and sign flip module (1010') and the second output (1050') of the combined attenuator and sign flip module (1010').

Apparatus Embodiment 6. The vector modulator vector based phase shifter (400) of Apparatus Embodiment 2, wherein the first sign flip circuit (4022) includes a first transformer (4052) and a first set of four switches (S1 4052, S2 4082, S3 4083, S4 4084), control inputs of the first four switches being coupled to a common sign flip control signal input (SFC1 4093); and wherein the second sign flip circuit (4026) includes a second transformer (4054) and a second set of four switches (S5 4085, S6 4086, S7 4087, S8 4088), control inputs of the four switches (S5 4085, S6 4086, S7 4087, S8 4088) of the second set being coupled to a common sign flip control signal input (4094) of the second sign flip circuit (4026).

Apparatus Embodiment 7. The vector modulator based phase shifter (400) of Apparatus Embodiment 2, wherein the combiner (4070) is implemented as a wideband coupler that includes a first transmission line (4074), a second transmission line (4076), and a resistor (4078).

Apparatus Embodiment 8. The vector modulator based phase shifter (400) of Apparatus Embodiment 7, wherein the first input (4062) of the combiner (4070) is coupled to a first side of the resistor (4078) and a first side of the first transmission line (4074) and where a second side of the first transmission line (4070) is coupled to the output (4072) of the vector modulator based phase shifter (400); and wherein the second input (4064) of the combiner (4070) is coupled to a second side of the resistor (4078) and a first side of the second transmission line (4076) and where a second side of the second transmission line (4076) is coupled to the output (4072) of the vector modulator based phase shifter (400).

Apparatus Embodiment 9. The vector modulator based phase shifter (200) of Apparatus Embodiment 8, wherein said first attenuator (1020) is implemented as a first series of controllable attenuators (5070, 5072, 5074, 5076, 5078) which have independent control inputs (AC1V.5 dB, ACV2 dB, ACV8 dB, ACV4 dB, ACV1 dB).

Apparatus Embodiment 10. The vector modulator based phase shifter (200) of Method Embodiment 8, wherein said series of controllable attenuators (5070, 5072, 5074, 5076, 5078) includes a series of at least three attenuators, said series of at least 3 attenuators including a first attenuator (5070), a second attenuator (5072) and a third attenuator (5074) each of the first, second and third attenuators (5070, 5072, 5074) including at least one transistor (e.g. FET) (5104, 5120, 5138) having a first terminal (5301, 5302, 5303) coupled to a resistor (5102, 5116, 5135) included in the attenuator, a control input (5304, 5305, 5306) coupled to the control input (5106, 5124, 5146) of the attenuator in which the transistor is located and a third terminal (5307, 5308, 5309) coupled to ground (5101, 5101, 5101).

Apparatus 10A. The vector based modulator phase shifter (200) of claim 10, wherein the at least one transistor is a N-type MOSFET.

Apparatus Embodiment 11. The vector modulator based phase shifter (300 or 700) of Method Embodiment 8, wherein the first sign flip circuit (7022) is implemented using a wideband coupler (7079) having first and second pairs of terminals, the first terminal (7061) of the first pair of terminals serving as an input and the second terminal (7063) of the first pair of terminals serving as an output of the first sign flip circuit (7022), the first terminal (7065) of the second pair of terminals being coupled to a first switch (7077) to ground (7001) (e.g., via a short (7074) or low resistance path) or a high impendence (7074) depending on the position of the first switch (7077), the second terminal (7067) of the second pair of terminals being coupled by a second switch (7078) to ground (7001) (e.g., via a short (7076) or low resistance path) or a high impendence (7075) depending on the position of the second switch (7078), said first and second switches (7077, 7078) being controlled a control signal (SC1 7093) supplied to said first sign flip circuit (7022).

The techniques of various embodiments may be implemented using software, hardware and/or a combination of software and hardware. Various embodiments are directed to apparatus and/or systems, e.g., SPI interface devices, chips, array of chips, wireless communications systems, wireless terminals, user equipment (UE) devices, access points, e.g., a WiFi wireless access point, a cellular wireless AP, e.g., an eNB or gNB, user equipment (UE) devices, a wireless cellular systems, e.g., a cellular system, WiFi networks, etc. Various embodiments are also directed to methods, e.g., method of controlling and/or operating a system or device, e.g., a communications system, a SPI interface device, a chip, an array of chips, an access point, a base station, a wireless terminal, a UE device, etc. Various embodiments are also directed to machine, e.g., computer, readable medium, e.g., ROM, RAM, CDs, hard discs, etc., which include machine readable instructions for controlling a machine to implement one or more steps of a method. The computer readable medium is, e.g., non-transitory computer readable medium.

It is understood that the specific order or hierarchy of steps in the processes and methods disclosed is an example of exemplary approaches. Based upon design preferences, it is understood that the specific order or hierarchy of steps in the processes and methods may be rearranged while remaining within the scope of the present disclosure. The accompanying method claims present elements of the various steps in a sample order, and are not meant to be limited to the specific order or hierarchy presented. In some embodiments, one or more processors are used to carry out one or more steps of the each of the described methods.

In various embodiments each of the steps or elements of a method are implemented using one or more processors. In some embodiments, each of elements or steps are implemented using hardware circuitry.

In various embodiments nodes and/or elements described herein are implemented using one or more components to perform the steps corresponding to one or more methods, for example, controlling, establishing, generating a message, message reception, signal processing, sending, communicating, e.g., receiving and transmitting, comparing, making a decision, selecting, making a determination, modifying, controlling determining and/or transmission steps. Thus, in some embodiments various features are implemented using components or in some embodiments logic such as for example logic circuits. Such components may be implemented using software, hardware or a combination of software and hardware. Many of the above described methods or method steps can be implemented using machine executable instructions, such as software, included in a machine readable medium such as a memory device, e.g., RAM, floppy disk, etc. to control a machine, e.g., general purpose computer with or without additional hardware, to implement all or portions of the above described methods, e.g., in one or more nodes. Accordingly, among other things, various embodiments are directed to a machine-readable medium, e.g., a non-transitory computer readable medium, including machine executable instructions for causing a machine, e.g., processor and associated hardware, to perform one or more of the steps of the above-described method(s). Some embodiments are directed to a device, e.g., a SPI interface device, a chip, a device including an array of chips with using a common SPI interface bus, a wireless communications device including a multi-element antenna array supporting beam forming, such as a cellular AP or Wifi AP, a wireless terminal, a UE device, etc., including a processor configured to implement one, multiple or all of the steps of one or more methods of the invention.

In some embodiments, the processor or processors, e.g., CPUs, of one or more devices, are configured to perform the steps of the methods described as being performed by the devices, e.g., communication nodes. The configuration of the processor may be achieved by using one or more components, e.g., software components, to control processor configuration and/or by including hardware in the processor, e.g., hardware components, to perform the recited steps and/or control processor configuration. The components may be implemented using software and/or hardware.

Some embodiments are directed to a computer program product comprising a computer-readable medium, e.g., a non-transitory computer-readable medium, comprising code for causing a computer, or multiple computers, to implement various functions, steps, acts and/or operations, e.g., one or more steps described above. Depending on the embodiment, the computer program product can, and sometimes does, include different code for each step to be performed. Thus, the computer program product may, and sometimes does, include code for each individual step of a method, e.g., a method of controlling a SPI interface device, a chip, an array of chips, a wireless communications device such as an access point. The code may be in the form of machine, e.g., computer, executable instructions stored on a computer-readable medium, e.g., a non-transitory computer-readable medium, such as a RAM (Random Access Memory), ROM (Read Only Memory) or other type of storage device. In addition to being directed to a computer program product, some embodiments are directed to a processor configured to implement one or more of the various functions, steps, acts and/or operations of one or more methods described above. Accordingly, some embodiments are directed to a processor, e.g., CPU, configured to implement some or all of the steps of the methods described herein. The processor may be for use in, e.g., a SPI interface device, a chip, a wireless communications device such as an access point described in the present application.

Numerous additional variations on the methods and apparatus of the various embodiments described above will be apparent to those skilled in the art in view of the above description. Such variations are to be considered within the scope. Numerous additional embodiments, within the scope of the present invention, will be apparent to those of ordinary skill in the art in view of the above description and the claims which follow. Such variations are to be considered within the scope of the invention.

What is claimed is:

1. A vector modulator based phase shifter comprising:
  an In-phase and Quadrature phase (IQ) signal generator including a radio frequency (RF) signal input, an in-phase (I) signal output and a quadrature (Q) signal output;
  a combined signal attenuator and sign flip module having an in-phase (I) signal input coupled to the I signal output of the IQ signal generator and having a quadrature (Q) signal input coupled to a quadrature (Q) signal output of the IQ signal generator, said combined signal attenuator and sign flip module including a first output coupled to said I signal input of the combined signal attenuator and sign flip module by a first attenuator and a first sign flip circuit arranged in series and further including a second output coupled to said Q signal input of the combined signal attenuator and sign flip module by a second attenuator and a second sign flip circuit; and
  a signal combiner including a first RF signal input and a second RF signal input coupled to the first and second signal outputs of said combined signal attenuator and sign flip module and having an RF signal output which serves as an output of the vector modulator based phase shifter; and
  wherein the vector modulator based phase shifter is a passive device which applies signal attenuation without applying any positive signal gain to signals passing through the vector modulator based phase shifter; and
  wherein the vector modulator based phase shifter is a bidirectional device with the RF signal output operating as a RF signal input when a RF signal is applied to the RF signal output and with the RF signal input operating as a signal output when a RF signal is applied to the RF signal output.

2. The vector modulator based phase shifter of claim 1, wherein the vector modulator based phase shifter is a wideband device.

3. The vector modulator based phase shifter of claim 1, wherein the vector modulator based phase shifter is a wideband device supporting a frequency range from 24 GHz to 29.5 GHz.

4. The vector modulator based phase shifter of claim 1,
  wherein the first attenuator precedes said first sign flip circuit in a series connection extending between the I signal input of the combined signal attenuator and sign flip module and the first output of the combined signal attenuator and sign flip module; and
  wherein the second attenuator precedes said second sign flip circuit in a series connection extending between the Q signal input of the combined signal attenuator and sign flip module and the second output of the combined signal attenuator and sign flip module.

5. The vector modulator based phase shifter of claim 1,
  wherein the first attenuator follows said first sign flip circuit in a series connection extending between the I signal input of the combined signal attenuator and sign flip module and the first output of the combined signal attenuator and sign flip module; and
  wherein the second attenuator follows said second sign flip circuit in a series connection extending between the Q signal input of the combined signal attenuator and sign flip module and the second output of the combined signal attenuator and sign flip module.

6. The vector modulator based phase shifter of claim 1,
  wherein the first sign flip circuit includes a first transformer and a first set of four switches, control inputs of the first four switches being coupled to a common sign flip control signal input; and
  wherein the second sign flip circuit includes a second transformer and a second set of four switches, control inputs of the four switches of the second set being coupled to a common sign flip control signal input of the second sign flip circuit.

7. A vector modulator based phase shifter comprising:
an In-phase and Quadrature phase (IQ) signal generator including a radio frequency (RF) signal input, an in-phase (I) signal output and a quadrature (Q) signal output;
a combined signal attenuator and sign flip module having an in-phase (I) signal input coupled to the I signal output of the IQ signal generator and having a quadrature (Q) signal input coupled to a quadrature (Q) signal output of the IQ signal generator, said combined signal attenuator and sign flip module including a first output coupled to said I signal input of the combined signal attenuator and sign flip module by a first attenuator and a first sign flip circuit arranged in series and further including a second output coupled to said Q signal input of the combined signal attenuator and sign flip module by a second attenuator and a second sign flip circuit; and
a signal combiner including a first RF signal input and a second RF signal input coupled to the first and second signal outputs of said combined signal attenuator and sign flip module and having an RF signal output which serves as an output of the vector modulator based phase shifter; and
wherein the vector modulator based phase shifter is a passive device which applies signal attenuation without applying any positive signal gain to signals passing through the vector modulator based phase shifter; and
wherein the signal combiner is implemented as a wideband coupler that includes a first transmission line, a second transmission line, and a resistor.

8. The vector modulator based phase shifter of claim 7, wherein the first input of the signal combiner is coupled to a first side of the resistor and a first side of the first transmission line and wherein a second side of the first transmission line is coupled to the output of the vector modulator based phase shifter; and wherein the second input of the signal combiner is coupled to a second side of the resistor and a first side of the second transmission line and wherein a second side of the second transmission line is coupled to the output of the vector modulator based phase shifter.

9. The vector modulator based phase shifter of claim 8, wherein said first attenuator is implemented as a first series of controllable attenuators which have independent control inputs.

10. The vector modulator based phase shifter of claim 9, wherein said first series of controllable attenuators includes a series of at least three attenuators, said series of at least 3 attenuators including a first attenuator, a second attenuator and a third attenuator each of the first, second and third attenuators including at least one transistor having a first terminal coupled to a resistor included in the attenuator, a control input coupled to the control input of the attenuator in which the transistor is located and a third terminal coupled to ground.

11. The vector modulator based phase shifter of claim 10, wherein the at least one transistor is a N-type MOSFET.

12. The vector modulator based phase shifter of claim 8, wherein the first sign flip circuit is implemented using a wideband coupler having first and second pairs of terminals, the first terminal of the first pair of terminals serving as an input and the second terminal of the first pair of terminals serving as an output of the first sign flip circuit, the first terminal of the second pair of terminals being coupled to a first switch to ground or a high impendence depending on the position of the first switch, the second terminal of the second pair of terminals being coupled by a second switch to ground or a high impendence depending on the position of the second switch, said first and second switches being controlled by a control signal supplied to said first sign flip circuit.

* * * * *